(12) United States Patent
Goto

(10) Patent No.: US 7,105,100 B2
(45) Date of Patent: Sep. 12, 2006

(54) SYSTEM AND METHOD FOR GAS DISTRIBUTION IN A DRY ETCH PROCESS

(75) Inventor: Haruhiro H. Goto, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 98 days.

(21) Appl. No.: 10/672,002

(22) Filed: Sep. 25, 2003

(65) Prior Publication Data

US 2005/0077010 A1    Apr. 14, 2005

Related U.S. Application Data

(60) Continuation of application No. 09/336,251, filed on Jun. 18, 1999, now abandoned, which is a division of application No. 09/061,013, filed on Apr. 15, 1998, now Pat. No. 5,980,686.

(51) Int. Cl.
*B44C 1/22* (2006.01)
*H01L 21/00* (2006.01)
*G01L 21/30* (2006.01)

(52) U.S. Cl. ............................ 216/58; 216/59; 216/67; 216/71; 438/706; 438/708; 438/711; 156/345.22; 156/345.23

(58) Field of Classification Search .................. 216/67, 216/71, 58, 59; 438/707, 708, 711, 706; 156/345.22, 345.23
See application file for complete search history.

(56) References Cited

U.S. PATENT DOCUMENTS

| | | | |
|---|---|---|---|
| 5,269,847 A | 12/1993 | Anderson et al. | |
| 5,328,558 A * | 7/1994 | Kawamura | .................. 438/707 |
| 5,356,515 A | 10/1994 | Tahara et al. | |
| 5,453,124 A | 9/1995 | Moslehi et al. | |
| 5,496,408 A | 3/1996 | Motoda et al. | |
| 5,500,256 A | 3/1996 | Watabe | |
| 5,532,190 A * | 7/1996 | Goodyear et al. | .......... 438/710 |
| 5,607,602 A | 3/1997 | Su et al. | |
| 5,683,517 A | 11/1997 | Shan | |
| 5,683,548 A | 11/1997 | Hartig et al. | |
| 5,698,070 A | 12/1997 | Hirano et al. | |
| 5,792,261 A * | 8/1998 | Hama et al. | .............. 118/723 I |

(Continued)

FOREIGN PATENT DOCUMENTS

JP    58-087328    7/1981

(Continued)

*Primary Examiner*—Shamim Ahmed
(74) *Attorney, Agent, or Firm*—Moser IP Law Group

(57) ABSTRACT

A system and method for distributing gas to a substrate in a dry etch chamber make use of different flow channels to distribute the gas to different portions of a substrate. A first flow channel can be oriented to distribute gas to an inner portion of the substrate. A second flow channel can be oriented to distribute gas to an outer portion of the substrate. With different flow channels, the system and method enable separate control of gas distribution for different portions of the substrate. In particular, the flow channels allow separate control of gas flow rate, concentration, and flow time for different areas of the substrate. In this manner, gas distribution can be selectively controlled to compensate for different etch rates across the substrate surface. Also, gas distribution can be controlled as a function of etch rate patterns exhibited by different etch gasses used in successive process steps. Thus, etch uniformity can be enhanced, leading to improvement in the quality of the overall fabrication process. In a semiconductor fabrication processes, enhanced etch uniformity can lead to increased device yield.

18 Claims, 4 Drawing Sheets

U.S. PATENT DOCUMENTS

| | | |
|---|---|---|
| 6,083,344 A | 7/2000 | Hanawa et al. |
| 6,090,210 A | 7/2000 | Balance et al. |
| 6,125,788 A * | 10/2000 | Hills et al. ............. 156/345.51 |
| 6,333,272 B1 | 12/2001 | McMillin et al. |

FOREIGN PATENT DOCUMENTS

| | | |
|---|---|---|
| JP | 407090572 | 4/1995 |
| JP | 10-158844 | 6/1998 |

* cited by examiner

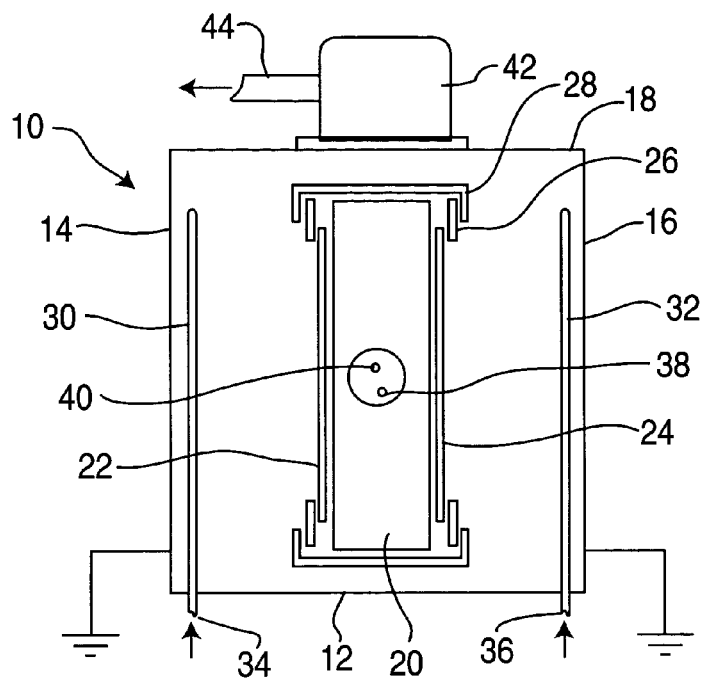
FIG. 1
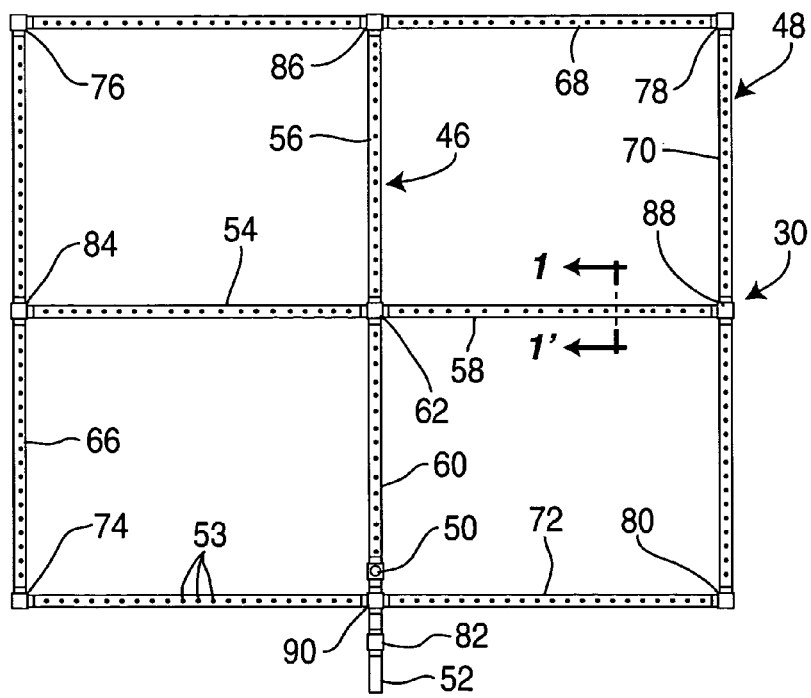 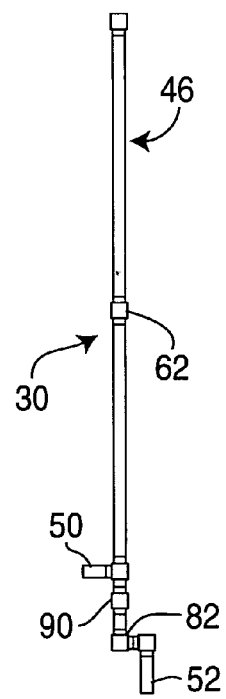
FIG. 2A      FIG. 2B

SYSTEM AND METHOD FOR GAS DISTRIBUTION IN A DRY ETCH PROCESS

CROSS-REFERENCE TO RELATED APPLICATIONS

This application is a continuation of U.S. patent application Ser. No. 09/336,251, filed Jun. 18, 1999, now abandoned, which is a divisional of U.S. patent application Ser. No. 09/061,013, filed Apr. 15, 1998, now U.S. Pat. No. 5,980,686.

The present invention relates to dry etch processing, and, more particularly, to techniques for distribution of gas used in a dry etch process.

Dry etch processing is used to selectively remove patterned material from the surface of a substrate. The dry etch process involves introduction of a gas into an etch chamber. The gas serves as the etch medium. The gas is typically distributed by a set of gas flow conduits coupled to a gas supply. The gas flow conduits are arranged over the substrate and include a pattern of holes that form gas outlets.

The substrate to be processed is mounted on a cathode. An electric field applied between the cathode and an anode, e.g., the wall of the etch chamber, excites the gas to generate a plasma The plasma breaks down the gas distributed from the gas outlets into chemically reactive species. Also, the plasma ionizes the gas, enhancing the mobility of the gas particles to transport to the substrate under the influence of the electric field.

The gas ions strike the substrate surface, reacting with the surface material to remove it from the substrate. In some applications, the plasma also creates a sputtering effect. Specifically, the ions strike the substrate surface with sufficient impact energy to cause physical removal of the surface material. In either case, the result is selective removal of the surface material. A molecular pump draws the material out of the chamber.

Uniformity of the dry etch phase is a critical factor in the quality of the overall fabrication process. In semiconductor device fabrication, for example, significant nonuniformities such as over-etch or under-etch can directly impact device yield. Etch uniformity is particularly troublesome in large area applications, such as flat panel display fabrication. Some large area applications require substrates having surface areas on the order of 600×720 mm. As substrate surface areas increase, the problems of etch uniformity and resulting yield are compounded.

Etch uniformity across the substrate surface is typically a product of etch rate. For a variety of reasons, an etch gas may etch different portions of the substrate surface at different rates. For example, an etch gas may etch an inner portion of the substrate more quickly than an outer portion, or vice versa. The etch rate may vary, for example, due to cross-substrate differences in mask pattern, gas concentration, gas flow rate, or electric field strength. Moreover, the effect of such variations can be inconsistent for different etch gases or steps. Consequently, in a fabrication process involving multiple dry etch phases with different etch gasses, etch uniformity can differ from layer to layer. The end result can be decreased fabrication quality and yield.

SUMMARY

The present invention is directed to a system and method for distributing gas to a substrate in a dry etch chamber. The gas distribution system and method make use of a first flow channel that is oriented to distribute gas to a first portion of the substrate, and a second flow channel that is oriented to distribute the gas to a second portion of the substrate. The first flow channel, for example, may take the form of an inner flow channel that distributes gas to an inner portion of the substrate. Similarly, the second flow channel may take the form of an outer flow channel that distributes gas to an outer portion of the substrate.

With first and second flow channels, the system and method enable selective control of gas distribution for different portions of the substrate. In this manner, gas distribution can be controlled to compensate for different etch rates across the substrate, e.g., between the center and edges of the substrate. Thus, etch uniformity can be improved, leading to improvements in the quality of the overall fabrication process. In a semiconductor fabrication process, for example, the enhanced etch uniformity can lead to increased device yield.

Gas distribution in different portions of the substrate can be separately controlled not only for a single gas, but for different gasses used in multiple etch steps. For example, one gas may exhibit a greater etch rate at an inner portion of the substrate than at an outer portion of the substrate. In contrast, a different gas may act in the opposite manner, exhibiting a greater etch rate at the outer portion for a different etch step or different substrate layer material. Flow through the first and second flow channels can be adjusted for different etch steps to provide targeted compensation for the characteristics of particular gasses or etch steps.

Differential control of the first and second flow channels can be achieved conveniently using one or more programmable mass flow controllers. Each mass flow controller can be disposed to control flow rate and/or time within one of the flow channels. The mass flow controllers can be programmed with different profiles for each flow channel, as well as for different gasses.

Also, the mass flow controllers can be programmed to control the composition of the gas distributed to different portions of the substrate via the first and second flow channel. For example, the concentration of the gas distributed via each channel can be controlled in a differential manner as a function of etch rate. As an alternative, flow can be controlled with a single mass flow controller in combination with one or more valves that can be actuated to terminate flow through a selected channel.

The system and method of the present invention enable convenient compensation of cross-substrate etch rate variation with little added expense, and without impacting process throughput. Consequently, the system and method are capable of achieving enhanced etch uniformity for dry etch processes involving existing and future substrate sizes.

In addition, the system and method provide flexibility for the varying etch rate characteristics that may arise from different gases, materials, mask patterns, and etch chambers. In particular, the system and method generally eliminate the need to change the setup of the etch chamber or transfer the substrate to a different chamber for a subsequent etch step due to differences in the etch characteristics exhibited by different gasses.

The present invention provides, in one aspect, a gas distribution system for distributing a gas to a substrate in an etch chamber, the system comprising: a gas supply containing a gas; a first flow channel coupled to the gas supply and oriented to distribute the gas to an inner portion of the substrate; and a second flow channel coupled to the gas supply and oriented to distribute the gas to an outer portion of the substrate.

In another aspect, the present invention provides a method for distributing a gas to a substrate in an etch chamber, the method comprising: distributing a gas to an inner portion of the substrate via a first flow channel; and distributing the gas to an outer portion of the substrate via a second flow channel.

Additionally, the present invention provides a gas distribution system for distributing a gas to a substrate in an etch chamber, the system comprising: a gas supply containing a gas; a first flow channel coupled to the gas supply and oriented to distribute the gas to an inner portion of the substrate; a second flow channel coupled to the gas supply and oriented to distribute the gas to an outer portion of the substrate; and a controller that controls the rate of flow of the gas through the first and second flow channels such that the rate of flow through the first flow channel is different than the rate of flow through the second flow channel.

The present invention further provides a method for distributing gas to a substrate in an etch chamber, the method comprising: distributing a gas to an inner portion of the substrate via a first flow channel; distributing the gas to an outer portion of the substrate via a second flow channel; and controlling the rate of flow of the gas through the first and second flow channels such that the rate of flow through the first flow channel is different than the rate of flow through the second flow channel.

Also, the present invention provides a method for etching a substrate comprising: distributing gas to an inner portion of the substrate via a first flow channel; distributing the gas to an outer portion of the substrate via a second flow channel; energizing the gas to remove material from the substrate; and controlling the flow of gas through the first and second flow channels to improve etch uniformity between the inner and outer portions of the substrate.

The present invention also provides a method for etching a substrate comprising: distributing a first gas to an inner portion of a layer of the substrate via a first flow channel; distributing the first gas to an outer portion of the layer of the substrate via a second flow channel; energizing the first gas to remove material from the layer of the substrate; controlling the flow of gas through the first and second flow channels to improve etch uniformity between the innner and outer portions of the layer of the substrate; distributing a second gas to an inner portion of a second layer of the substrate via the first flow channel; distributing the second gas to an outer portion of the second layer of the substrate via the second flow channel; energizing the second gas to remove material from the second layer of the substrate; and controlling the flow of gas through the first and second flow channels to improve etch uniformity between the inner and outer portions of the second layer of the substrate.

Further, the present invention provides a gas distribution system for distributing a gas to a substrate in an etch chamber, the system comprising: a gas supply containing a gas; a first flow channel coupled to the gas supply and oriented to distribute the gas to a first portion of the substrate; and a second flow channel coupled to the gas supply and oriented to distribute the gas to a second portion of the substrate.

The present invention, in a further aspect, provides a method for distributing a gas to a substrate in an etch chamber, the method comprising: distributing a gas to a first portion of the substrate via a first flow channel; and distributing the gas to a second portion of the substrate via a second flow channel.

Other advantages, features, and embodiments of the present invention will become apparent from the following detailed description and claims.

DESCRIPTION OF DRAWINGS

FIG. 1 is side view illustrating a dry etch chamber,

FIG. 2A is a plan view illustrating a gas distribution manifold;

FIG. 2B is a side view of the gas distribution manifold of FIG. 2B taken along line 2B—2B;

Like reference numbers and designations in the various drawings indicate like elements.

DETAILED DESCRIPTION

Figure 3:
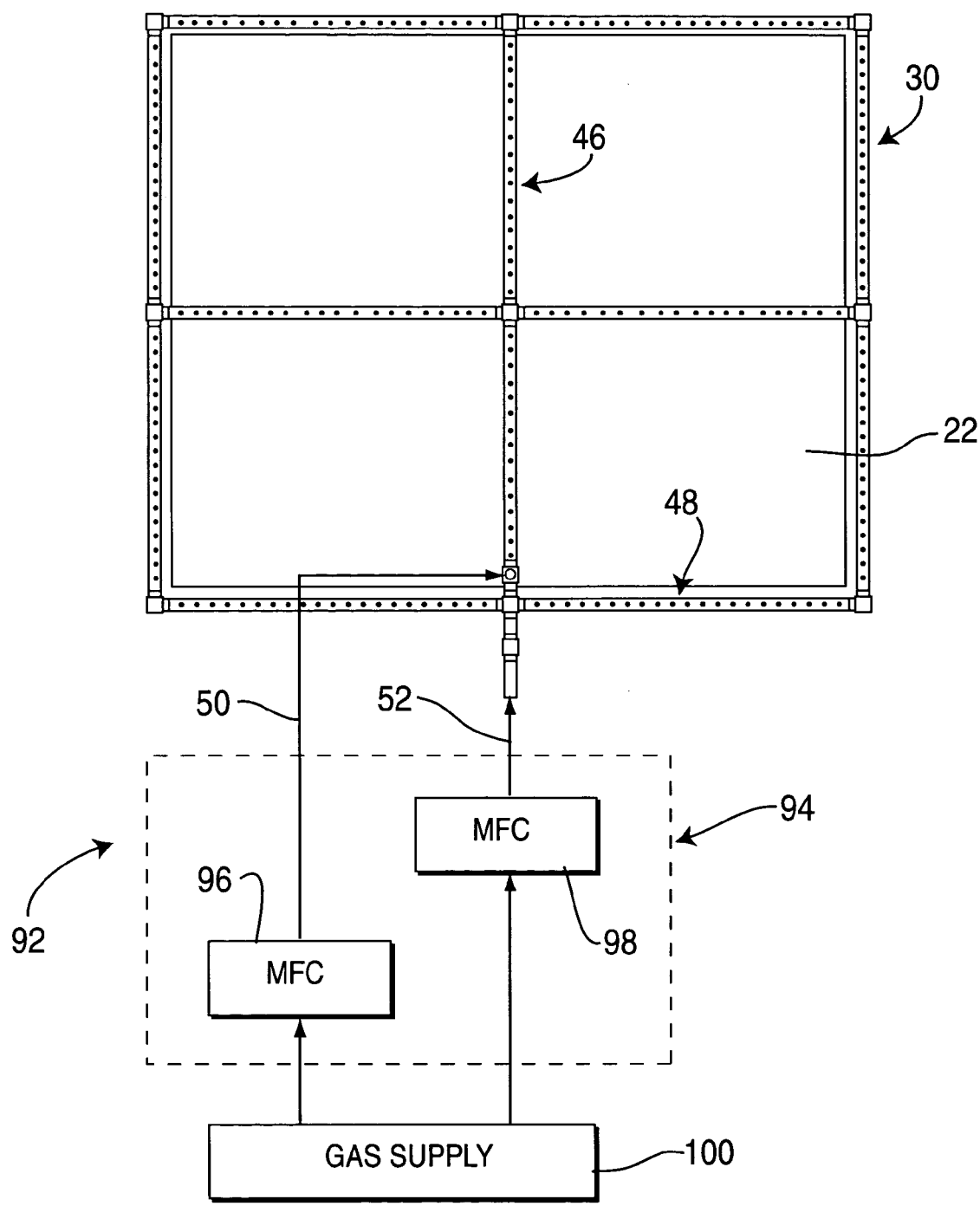
FIG. 3 is a functional block diagram of a gas distribution system incorporating a manifold as shown in FIGS. 2A and 2B.

FIG. 1 is a side view of a dry etch chamber 10. As shown in FIG. 1, chamber 10 includes: a bottom wall 12; opposing side walls 14, 16; top wall 18; and front and back walls (not shown in FIG. 1). Walls 12, 14, 16, 18 enclose a cathode 20. Cathode 20 is mounted within housing 12 and is configured to receive and support one or more substrates 22, 24. In particular, substrates 22, 24 are mounted on opposite sides of cathode 20 with mounting hardware including spacers 26 and clamps 28. Although substrates 22, 24 are shown for purposes of example, etch chamber 10 may be designed for the processing of a single substrate, or two or more substrates.

Chamber 10 further includes a first gas distribution manifold 30 mounted adjacent side wall 14 and opposite substrate 22 and a second gas distribution manifold 32 mounted adjacent side wall 16 and opposite substrate 24. Manifolds 30, 32 distribute etch gas to substrates 22, 24, respectively. If etch chamber 10 is designed for a single substrate, a single manifold may be used. An external gas supply (not shown in FIG. 1) delivers gas to manifolds 30, 32, as indicated by reference numerals 34, 36, via fittings that extend outside of etch chamber 10.

Cathode 20 is coupled to an RF power generator (not shown) via a cable, as indicated in cross-section by reference numeral 38. Chamber walls 14, 16 are coupled to ground and serve as the anode for the etch reaction. During the etch process, the electric potential applied between cathode 20 and chamber side walls 14, 16 by the power applied by the RF generator creates an electric field. The electric field excites the gas distributed by manifolds 30, 32, creating a plasma. Cathode 20 may include a conduit, as indicated by reference numeral 40, for water cooling.

The plasma breaks down the etch gas into reactive species that remove patterned material from the surfaces of substrates 22, 24. Etch chamber 10 may be configured to provide a sputter etch of substrates 22, 24, if desired. A pump 42 is mounted in an opening in top wall 18. Pump 42 may be a conventional turbo molecular pump (TMP). Pump 42 draws the removed material out of the interior of chamber 10 and directs it to a recovery reservoir, as indicated by reference numeral 44. The pumping pressure of pump 42 is set according to the etch rate and resultant rate at which material is removed from substrates 22, 24. In addition, a spectrophotometric etch time sensor (not shown) can be provided to monitor the progression of the etch process by reference to plasma-induced spectral emissions from the etch reactants.

FIG. 2A is a schematic diagram illustrating gas manifold 30. FIG. 2B is a side view of gas distribution manifold 30. Gas manifold 32 may take the same form as manifold 30, but only one manifold is shown for purposes of illustration. FIGS. 2A and 2B illustrate an exemplary structure suitable for practice of a method in accordance with an embodiment the present invention. As shown in FIG. 2A, manifold 30 includes a first flow channel 46 and a second flow channel 48. First flow channel 46 is coupled to a gas supply (shown in FIG. 3) via a first flow path 50, and is oriented to distribute the gas to a fist portion of substrate 22. Second flow channel 48 is coupled to the gas supply via a second flow path 52 separate from first flow path 50, and is oriented to distribute the gas to a second portion of substrate 22.

Each flow channel 46, 48 includes a pattern of holes 53 that serve as gas outlets to distribute gas over substrate 22. In the embodiment illustrated in FIGS. 2A and 2B, first flow channel 46 forms an inner flow channel that is oriented to distribute the gas to an inner portion of substrate 22. Second flow channel 48, as shown in FIG. 2A, forms an outer flow channel that is oriented to distribute the gas to an outer portion of substrate 22. First and second flow channels 46, 48 can be used to distribute gas separately to different locations on substrate 22.

The gas can be distributed to each portion with different flow rates that are selected to accommodate variations in the etch rates of a given gas across substrate 22. In this manner, gas can be distributed to an inner portion of substrate 22 at one flow rate, and to an outer or edge portion of substrate 22 at a different flow rate. If desired, manifold 30 could incorporate additional flow channels oriented to distribute gas to particular portions of substrate 22. For example, each of several flow channels could be oriented to cover particular zones across the surface of substrate 22. Gas could be distributed to the zones with different flow rates based on the particular etch characteristics within the zones.

With further reference to FIG. 2A, inner flow channel 46 may take the form of a plurality of flow conduits 54, 56, 58, 60 arranged in a cross-like pattern. Inner flow channel 46 is susceptible to a variety of arrangements, however, as necessary for effective coverage. Conduits 54, 56, 58, 60 can be coupled together in fluid communication with a central four-way fitting 62. An additional fitting 64 is provided to receive gas from first flow path 50. Outer flow channel 48 may take the form of a plurality of flow conduits 66, 68, 70, 72 arranged in a peripheral, rectangular pattern. Conduits 66, 68, 70, 72 can be coupled together in fluid communication with two-way corner fittings 74, 76, 78, 80. As shown in FIG. 2B, an additional fitting 82 is provided to receive gas from second flow path 52.

As shown in FIG. 2A, conduits 54, 56, 58, 60 can be coupled at one end to conduits 66, 68, 70, 72 for support via fittings 84, 86, 88, 90. To provide separate flow channels, conduits 54, 56, 58, 60 preferably are not in fluid communication with conduits 66, 68, 70, 72. First and second flow channels 46, 48 could be coupled, however, via selectively operable valves, as will be described with reference to FIG. 5. In this manner, manifold 30 could be selectively configured to provide either a single flow channel that integrates first and second flow channels 46, 48, or separate flow channels. To compensate for etch rate variation between different portions of substrate 22, separate use of first and second flow channels 46, 48 ordinarily will be desirable.

FIG. 3 is a functional block diagram of a gas distribution system 92 incorporating a manifold 30 as shown in FIGS. 2A and 2B. FIG. 3 illustrates exemplary structure suitable for practice of a method in accordance with an embodiment of the present invention. System 92 is described for use with gas manifold 30, but may be replicated for use with another manifold 32, if two or more manifolds are incorporated in etch chamber 10. Alternatively, a single system 92 can be used, provided that parallel flow paths are provided for flow to both manifolds 30, 32. As shown in FIG. 3, system 92 includes a controller 94 that controls the rate of flow of the gas through first and second flow channels 46, 48. To accommodate varying etch rates between different portions of substrate 22, e.g., the inner and edge portions, controller 94 can be configured such that the rate of flow through first flow channel 46 is different than the rate of flow through second flow channel 48.

To provide varying flow rates, controller 94 may incorporate first and second programmable mass flow controllers (MFC) 96, 98. First mass flow controller 96 is disposed in first flow path 50 between a gas supply 100 and first flow channel 46. Second mass flow controller 98 is disposed in second flow path 52 between gas supply 100 and second flow channel 48. Each mass flow controller 96, 98 can be realized by a conventional controller, and appropriately programmed according to the particular characteristics of the selected etch gas and the varying etch rates exhibited by the gas. Also, controllers can be provided to control the composition of the gas distributed by each flow channel 46, 48. In particular, such controllers can control the relative mixture of the gasses, as well as the relative temperatures of the gasses in the flow channels to achieve enhanced etch uniformity.

If the gas exhibits a faster etch rate in the inner portion of substrate 22 than at the edge, mass flow controller 96, 98 can be differentially programmed to provide a higher flow rate via second flow channel 48 or a lower flow rate via first flow channel 46. Similarly, if the opposite is true, mass flow controllers 96, 98 can be programmed to provide a higher flow rate via first flow channel 46 or a lower flow rate via second flow channel 48. In this manner, mass flow controllers 96, 98 can be configured to provide enhanced etch uniformity across the surface of substrate 22. For more precise uniformity, manifold 30 could include multiple flow channels that cover several zones across the surface of substrate 22. The rate of gas flow for each zone could be controlled using multiple mass flow controllers that set the respective flow rates based on the particular etch rate profile within the zone.

Mass flow controllers 96, 98 also can be programmed to provide particular flow rate profiles, i.e., variation in flow rate over the etch period. In particular, notwithstanding flow rate, mass flow controllers 96, 98 can be programmed to separately control the overall time of flow of gas through the first and second flow channels 46, 48, thereby providing differential gas distribution times at different portions of substrate 22. Flow time can be controlled in combination with flow rate. The time difference can be selected to produce greater etch uniformity between different portions, e.g., between the inner and edge portions of substrate 22. Again, substrate 22 can be divided into multiple zones that receive gas from additional flow channels. Multiple mass flow controllers could be configured to provide differential gas flow time across the zones, thereby providing precise areal adjustment of the etch process and enhanced etch uniformity.

By varying flow rate, mass flow controllers 96, 98 also operate to control the concentration of the gas that flows through first and second flow channels 46, 48, given a constant volume and pressure within chamber 10. For example, the relative flow rates can be adjusted by mass flow controllers 96, 98 such that gas can be distributed via second flow channel 48 with a greater concentration than gas distributed via first flow channel 46, or vice versa. Thus, relative concentrations can be controlled based on differential etch rates. Concentrations can be modulated either alone or in combination with adjustment of relative gas distribution time. Also, concentrations can be controlled not only for inner and outer portions of substrate 22, but for several individual zones. The end result is greater etch uniformity across the surface of substrate 22.

Also, mass flow controllers 96, 98 can be programmed separately for each etch gas used in the successive steps of a fabrication process. Specifically, in recognition that different gasses exhibit different etch rate characteristics across the surface of substrate 22, particularly with different substrate layer materials, mass flow controllers 96, 98 can be appropriately programmed to ensure etch uniformity for different etch steps. Consequently, system 92 generally eliminates the need to change the setup of chamber 10 or transfer substrate 22 to a different chamber for a subsequent etch step due to differences in the etch characteristics exhibited by different gasses. Rather, it is only a matter of loading mass flow controllers 94, 96 with programs appropriate for the particular etch step and gas to be distributed.

Figure 4:
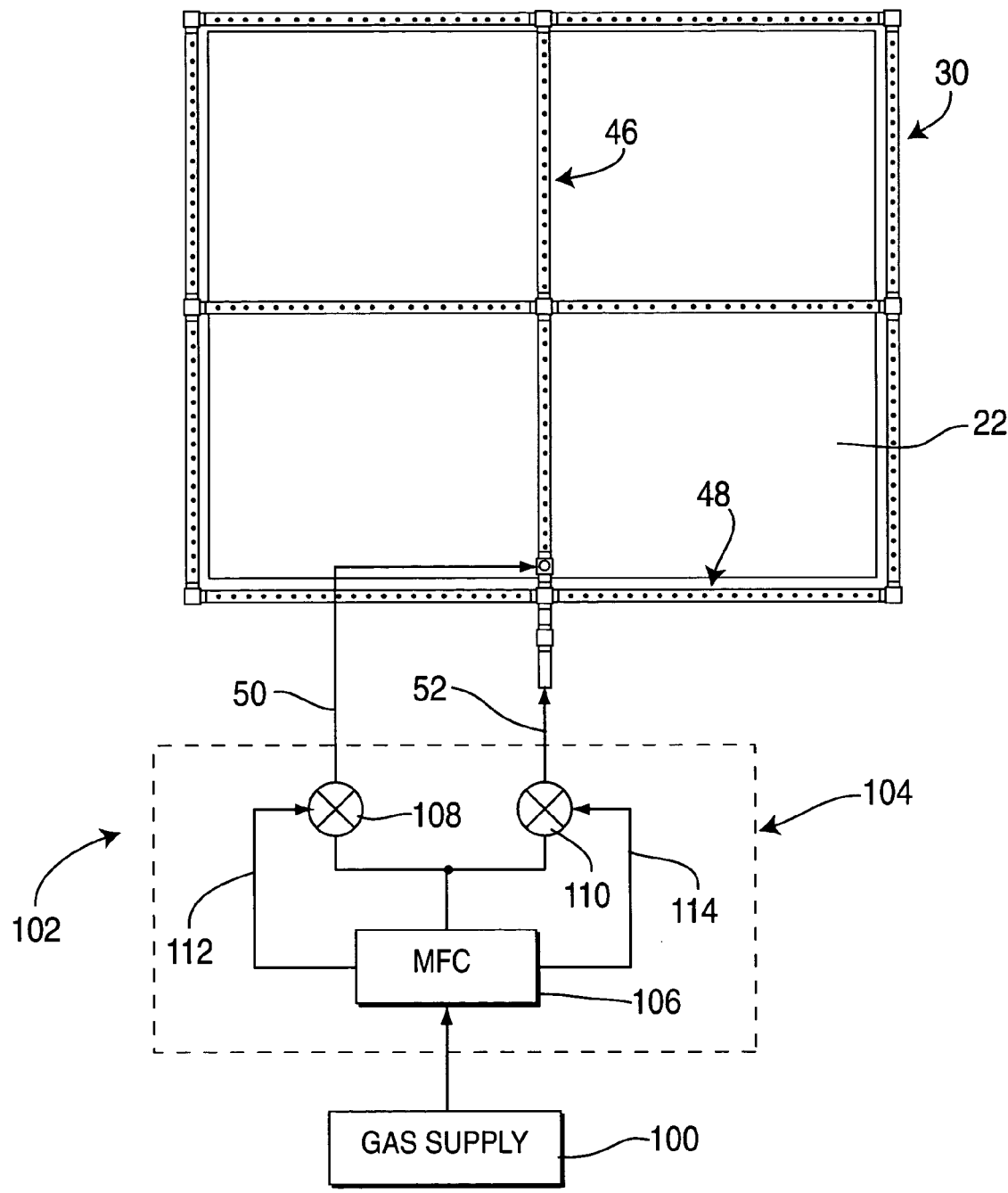
FIG. 4 is a functional block diagram of a second gas distribution system incorporating a manifold as shown in FIGS. 2A and 2B.

FIG. 4 is a functional block diagram of a second gas distribution system 102 incorporating a manifold 30 as shown in FIGS. 2A and 2B. System 102 of FIG. 4 substantially corresponds to system 92 of FIG. 3. Like system 92, for example, system 102 includes a controller 104 that controls the rate of gas flow through first and second flow channels 46, 48 via first and second flow paths 50, 52, respectively. As shown in FIG. 4, however, controller 104 includes only a single programmable mass flow controller 106 that controls the rate of flow of gas through both flow paths 50, 52. To compensate for differential etch rates, mass flow controller 106 is programmed to control valves 108, 110.

Valve 108 is disposed within first flow path 50, whereas valve 110 is disposed within second flow path 52. Mass flow controller 106 is programmed to selectively open and close valves 108, 110, as indicated by lines 112, 114, to control the gas flow time within flow paths 50, 52 and flow channels 46, 48. Mass flow controller 106 may require modification to control valves 108, 110. In particular, it may be necessary to equip mass flow controller 106 with control outputs for valves 108, 110, along with drive circuitry sufficient to actuate the solenoid, motor, or other mechanism associated with the valves for opening and closing.

Mass flow controller 106 opens both valves 108, 110 to allow flow of gas through flow paths 50, 52 at a particular flow rate. Instead of controlling the relative gas flow rates through paths 50, 52, mass flow controller 106 controls gas flow time in a differential mode by selectively closing one of the valves 108, 110 during the etch process. If a particular gas exhibits a higher etch rate within the inner portion of substrate 22, for example, mass flow controller 106 closes valve 108 earlier than valve 110. Valve 110 remains open for an extended period of time necessary for the etch process at the outer portion of substrate 22 to continue. In other words, the etch process at the outer portion of substrate 22 is allowed to proceed to a point approximately commensurate with the etch process in the inner portion. Thus, the timing at which valves 108, 110 are closed relative to one another is determined by reference to the difference in etch rate. Alternatively, valve 108 can be opened later than valve 10. In this case, valves 108, 110 are closed at the same time, but opened at different times to produce a difference in overall gas flow time.

Like system 92 described with respect to FIG. 3, system 102 allows manifold 30 to be used in a differential manner for a variety of etch gasses used in subsequent process steps. In this case, mass flow controller 106 is programmed to provide a particular flow rate, and also to control valves 108, 110 to provide differential flow times within flow channels 46, 48, as dictated by the particular gas, substrate layer material, or etch step. System 102 thereby avoids the need for changes to chamber 10 or the transfer of substrate 22 to a different chamber. Instead, the cross-substrate gas flow profile for a particular etch step can be easily changed by loading mass flow controller 106 with a different program.

Figure 5:
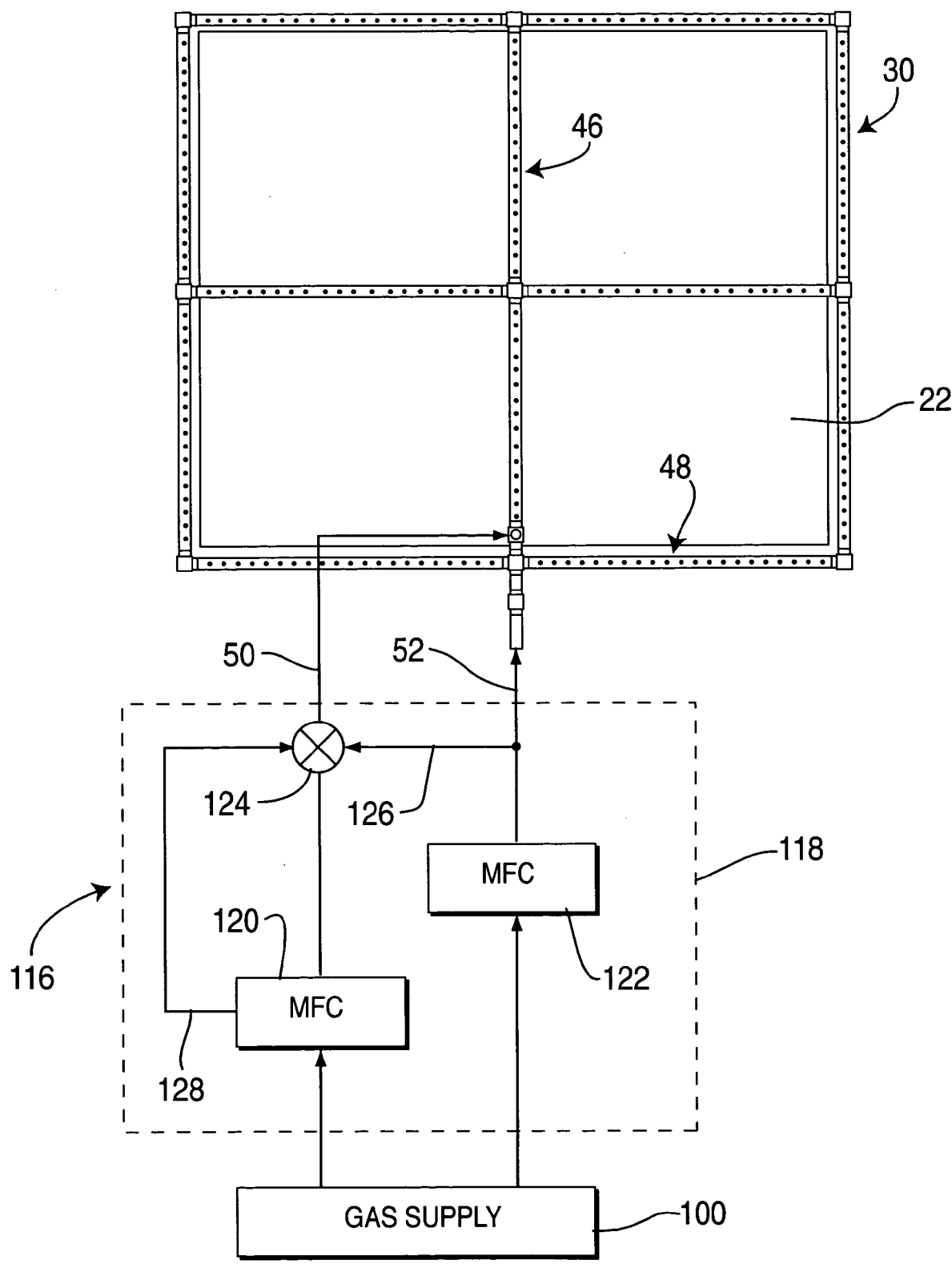
FIG. 5 is a functional block diagram of a third gas distribution system incorporating a manifold as shown in FIGS. 2A and 2B.

FIG. 5 is a functional block diagram of a third gas distribution system 116 incorporating a manifold 30 as shown in FIGS. 2A and 2B. System 116 substantially corresponds to system 92 of FIG. 3. In particular, system 116 includes a flow controller 118 that incorporates a first mass flow controller 120 and a second mass flow controller 122. Mass flow controller 120 is disposed to control the gas flow rate within first flow path 50 and, consequently, first flow channel 46. Mass flow controller 122 is disposed to control the gas flow rate within second flow path 52 and second flow channel 48. In addition to mass flow controllers 120, 122, however, system 116 includes a valve 124 that is, in effect, coupled between first and second flow channels 46, 48.

Valve 124 is disposed to control flow between mass flow controller 120 and first flow path 50. Also, valve 124 is disposed to control flow between second flow path 52 and first flow path 50, as indicated by line 126. Valve 124 is selectively operable to couple first flow channel 46 and second flow channel 48 in fluid communication with one another. Specifically, mass flow controller 120 is programmed to selectively open and close valve 124, as indicated by line 128. As an alternative, mass flow controller 122 could be programmed to open and close valve 124. In either case, selective actuation of valve 124 allows manifold 30 to be used in either a differential mode or a continuous flow mode.

In particular, valve 124 can be closed to flow from mass flow controller 120 while receiving flow from mass flow controller 122. In this mode, mass flow controller 122 distributes gas to both flow paths 50, 52 and, consequently, to both flow channels 46, 48. Flow channels 46, 48 thereby receive essentially the same gas flow at the same flow rate, and operate in a continuous mode to distribute gas in a generally uniform manner across substrate 22. It is noted that a substantially continuous mode, i.e., a mode producing a substantially common cross-substrate flow rate, also could be achieved with system 92 of FIG. 3 by simply programming mass flow controllers 96, 98 to deliver gas with the same flow rate to both flow channels 46, 48. However, flow channels 46, 48 would remain separated from one another in terms of fluid communication.

Alternatively, valve 124 can be open to receive flow from mass flow controller 120 but closed to flow from mass flow controller 122. In this mode, mass flow controller 120 distributes gas to flow path 50 and flow channel 46 at a first flow rate, whereas mass flow controller 122 distributes gas to flow path 52 and flow channel 48 at a second flow rate, which may be different than the first flow rate. Flow channels 46, 48 thereby can receive different gas flow at different flow rates, as desired, operating in a differential mode to distribute gas in a nonuniform manner across substrate 22. In particular, the gas flow rates of mass flow controllers 120, 122 are selected to compensate for differential etch rates in different portions of substrate 22, as described with reference to FIGS. 3 and 4.

As in system 92, relative gas flow rates can be selected in system 116 for particular gasses, substrate layer materials, and etch steps, to provide enhanced etch uniformity. At the same time, system 116 supports continuous flow regardless of the individual characteristics of a gas or etch step. In summary, system 116 enables gas to be distributed via a single manifold 30 in either a continuous mode in which a common gas flow rate is maintained across substrate 22, or a differential mode in which different gas flow rates are selected for different portions of substrate 22 based on the cross-substrate etch rate profile for a particular gas, substrate layer materials, or etch step. System 116 thereby offers significant flexibility in the design of the etch process.

System 116 also supports the control of relative flow times and concentration to achieve enhanced etch uninformity for different portions of substrate 22. Specifically, as in systems 92, 102, flow rate can be modulated by mass flow controllers 120, 122 to achieve varied concentrations between the gas distributed by flow channels 46, 48, respectively. Also, in the differential mode, mass flow controllers 120, 122 can be programmed to produce different flow times within flow channels 46, 48.

The foregoing detailed description has been provided for a better understanding of the invention and is for exemplary purposes only. Modifications may be apparent to those skilled in the art without deviating from the spirit and scope of the appended claims.

What is claimed is:

1. A method for etching a substrate, comprising:
   (a) etching the substrate in a first step, wherein the first step comprises:
      supplying a first etch gas at a first rate to a first portion of the substrate through a first flow channel; and
      supplying the first etch gas at a second rate to a second portion of the substrate through a second flow channel, wherein the first rate is different than the second rate, and wherein the first portion is different from the second portion; and
   (b) etching the substrate in a second step, wherein the first step is different from the second step, and wherein the second step comprises:
      supplying a second etch gas at a third rate to the first portion of the substrate through the first flow channel; and
      supplying the second etch gas at a fourth rate to the second portion of the substrate through the second flow channel, wherein the third rate is different that the fourth rate.

2. The method of claim claim 1, wherein the first gas is different than the second gas.

3. The method of claim 1, wherein the first rate is greater than the second rate.

4. The method of claim 1, wherein the first rate is less than the second rate.

5. The method of claim 1, wherein the third rate is greater than the fourth rate.

6. The method of claim 1, wherein the third rate is less than the fourth rate.

7. The method of claim 1, further comprising:
   supplying the first gas to the first portion for a first period of time; and
   supplying the first gas to the second portion for a second period of time that is different than the first period of time.

8. The method of claim 1, further comprising:
   supplying the second gas to the first portion for a first period of time; and
   supplying the second gas to the second portion for a second period of time that is different than the first period of time.

9. The method of claim 1, wherein the first portion is an inner portion of the substrate and the second portion is an outer portion of the substrate.

10. The method of claim 1, further comprising:
    supplying the first gas to at least a third portion of the substrate.

11. The method of claim 1, wherein the first step etches a first layer of the substrate.

12. The method of claim 11, wherein the second step etches the first layer of the substrate.

13. The method of claim 11, wherein the second step etches a second layer of the substrate.

14. The method of claim 1, wherein the first gas is supplied to the first portion of the substrate through a first flow controller and to the second portion of the substrate through a second flow controller.

15. The method of claim 14, wherein the second gas is supplied to the first portion of the substrate through the first flow controller and to the second portion of the substrate through the second flow controller.

16. A method for etching a substrate, comprising:
    controlling the supply of a first etch gas to a first portion of the substrate through a first flow channel and to a second portion of the substrate through a second flow channel to etch the substrate during a first etch step, wherein the first portion is different than the second portion; and
    controlling the supply of a second etch gas to the first portion of the substrate through the first flow channel and to the second portion of the substrate through the second flow channel during a second etch step, wherein the first etch step is different that the second etch step.

17. The method of claim 16, wherein the first gas is supplied to the first portion of the substrate through a first flow controller and to the second portion of the substrate through a second flow controller.

18. The method of claim 17, wherein the second gas is supplied to the first portion of the substrate through the first flow controller and to the second portion of the substrate through the second flow controller.

* * * * *

UNITED STATES PATENT AND TRADEMARK OFFICE
CERTIFICATE OF CORRECTION

PATENT NO. : 7,105,100 B2 Page 1 of 1
APPLICATION NO. : 10/672002
DATED : September 12, 2006
INVENTOR(S) : Goto It is certified that error appears in the above-identified patent and that said Letters Patent is hereby corrected as shown below:

In column 1, line 25, delete "plasma The" and insert -- plasma. The--, therefor.

In column 3, line 43, delete "innner" and insert -- inner --, therefor.

In column 4, line 7, delete "chamber," and insert -- chamber; --, therefor.

In column 5, line 16, delete "fist" and insert -- first --, therefor.

In column 9, line 58, in Claim 2, after "claim" delete "claim".
(Second Occurrence)

Signed and Sealed this

Second Day of January, 2007

JON W. DUDAS
*Director of the United States Patent and Trademark Office*